(12) United States Patent
Yoo

(10) Patent No.: US 7,286,440 B2
(45) Date of Patent: Oct. 23, 2007

(54) PSEUDO SRAM WITH COMMON PAD FOR ADDRESS PIN AND DATA PIN

(75) Inventor: Seong-Nyuh Yoo, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 53 days.

(21) Appl. No.: 11/146,042

(22) Filed: Jun. 7, 2005

(65) Prior Publication Data

US 2006/0023563 A1 Feb. 2, 2006

(30) Foreign Application Priority Data

Jul. 27, 2004 (KR) ............... 10-2004-0058810

(51) Int. Cl.
*G11C 8/00* (2006.01)
(52) U.S. Cl. .................... 365/233; 365/233.5
(58) Field of Classification Search ........... 365/233, 365/233.5
See application file for complete search history.

(56) References Cited

U.S. PATENT DOCUMENTS

| 4,807,192 | A | 2/1989 | Nakano et al. |
| 5,331,596 | A | 7/1994 | Miyazawa et al. |
| 5,652,723 | A | 7/1997 | Dosaka et al. |
| 5,798,976 | A | 8/1998 | Arimoto |
| 6,026,029 | A | 2/2000 | Dosaka et al. |
| 6,345,012 | B1 | 2/2002 | Casper |
| 6,891,775 | B2 * | 5/2005 | Takeuchi ............. 365/233.5 |
| 2003/0123319 | A1 * | 7/2003 | Kim ..................... 365/233 |
| 2005/0232067 | A1 * | 10/2005 | Takeuchi ............. 365/233.5 |
| 2006/0039205 | A1 * | 2/2006 | Cornelius ............ 365/189.05 |
| 2006/0133188 | A1 * | 6/2006 | Ha et al. ............... 365/233 |

FOREIGN PATENT DOCUMENTS

| JP | 11-312386 A | 11/1999 |
| JP | 2002-230977 | 8/2002 |
| KR | 1999-0079289 | 11/1999 |
| KR | 2000-0065601 | 11/2000 |

* cited by examiner

*Primary Examiner*—Michael Tran
(74) *Attorney, Agent, or Firm*—McDermott Will & Emery LLP

(57) ABSTRACT

Provided are a semiconductor memory device and a driving method thereof, which can reduce power consumption and operation delay time by preventing an overlapped driving of word lines. The pseudo SRAM includes: an address input unit for receiving an address through a pin and outputting the received address as an internal address; a transition detecting unit for detecting a transition of the internal address; a word line (WL) driving signal generating unit for generating a WL driving signal in response to an output signal of the transition detecting unit; and a control signal generating unit, in response to a pin select signal, for generating a first control signal for controlling the address input unit to output only an valid address as the internal address, and a second control signal for controlling the WL driving signal generating unit to activate the WL driving signal.

29 Claims, 11 Drawing Sheets

(PIROR ART)

(PIROR ART)

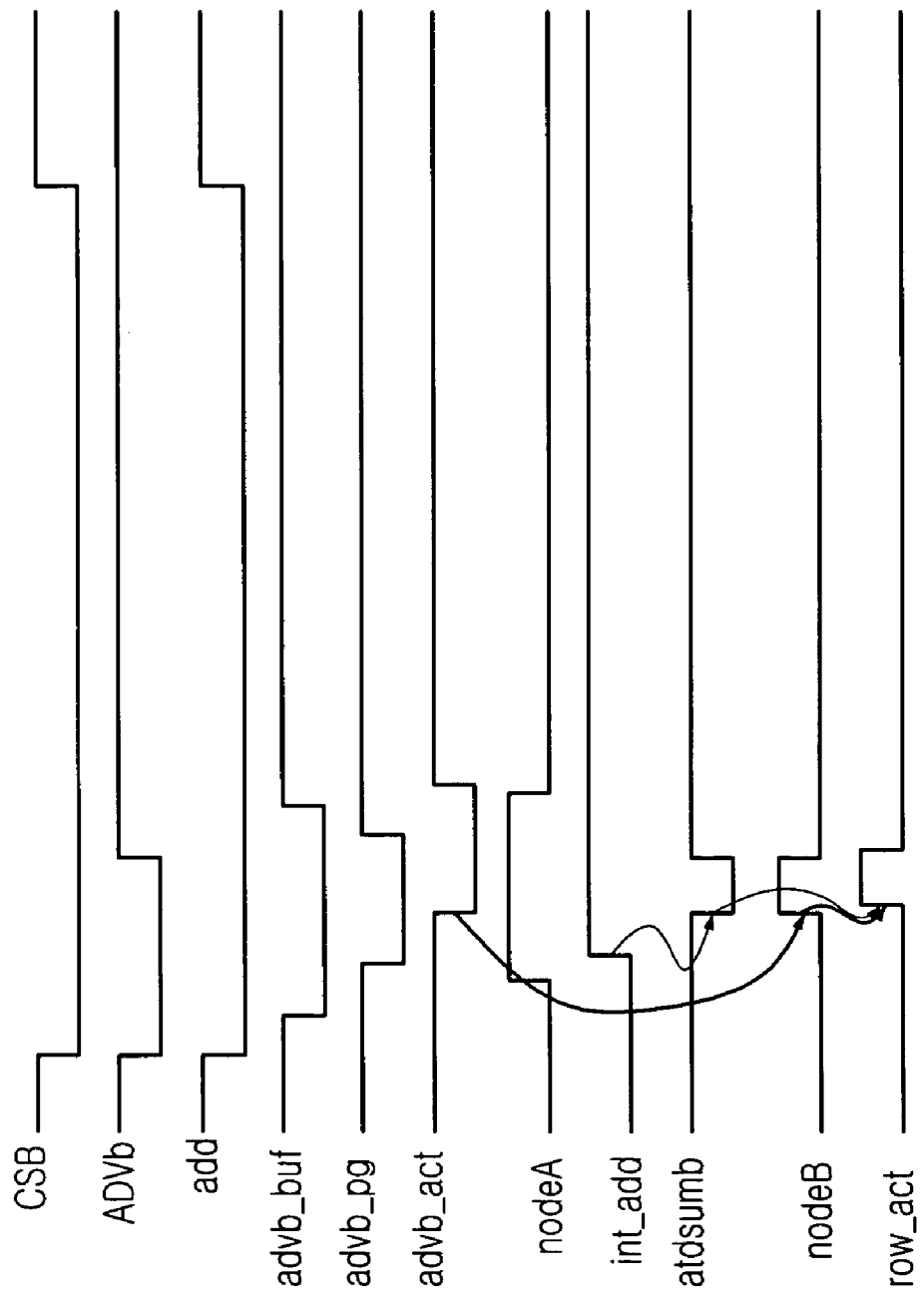

US 7,286,440 B2

PSEUDO SRAM WITH COMMON PAD FOR ADDRESS PIN AND DATA PIN

FIELD OF INVENTION

The present invention relates to a semiconductor design technique; and, more particularly, to a semiconductor memory device and a driving method thereof, which can reduce power consumption and operation delay time by preventing an overlapped driving of word lines.

DESCRIPTION OF PRIOR ART

A dynamic random access memory (DRAM) is well known as a semiconductor memory device having a plurality of memory cells. In the DRAM, a memory cell consists of one transistor and one capacitor. Since the memory cell can be configured in small size, the DRAM is advantageous to high integration. However, the DRAM requires a refresh operation at regular periods so as to retain data stored in the memory cell. On the contrary, a static RAM (SRAM) is configured with a latch-type memory cell, so that a refresh operation is not required. However, since a unit cell is configured with a plurality of transistors, the degree of integration is not higher than the DRAM.

A pseudo SRAM and a virtual SRAM are well known as a memory device having advantages of both DRAM and SRAM, that is, a memory device having usage convenience of SRAM and high integration of DRAM. Both of the pseudo SRAM and the virtual SRAM use a capacitor in a memory cell, but do not require a refresh operation, resulting in usage convenience.

FIG. 1 is a block diagram of a conventional pseudo SRAM.

Referring to FIG. 1, the conventional pseudo SRAM includes an address input unit 10, a transition detecting unit 20, and a word line (WL) driving signal generating unit 30. The address input unit 10 receives an address add in response to a buffer driving signal buf_enb. The transition detecting unit 20 detects a transition of an output signal int_add of the address input unit 10 and generates an address transition detecting signal atdsumb. The WL driving signal generating unit 30 generates a WL driving signal row_act in response to the address transition detecting signal atdsumb and a chip select signal chip_sel.

A procedure of generating the WL driving signal in the pseudo SRAM will be described below.

First, when a chip select command CSB is inputted to activate the buffer driving signal buf_enb, the address input unit 10 outputs the received address add as the internal address int_add in response to the buffer driving signal buf_enb. Then, when the transition detecting unit 20 detects the transition of the internal address int_add, it activates the address transition detecting signal atdsumb. The WL driving signal generating unit 30 activates the word line by enabling the WL driving signal row_act in response to the address transition detecting signal atdsumb inputted during the activation of the chip select signal chip_sel.

Even though the buffer driving signal buf_enb is activated by the input of the chip select command CBS, the address transition detecting signal atdsumb is not activated if a previous address and a current address are identical to each other. In order to solve the problem, the WL driving signal generating unit 30 activates the WL driving signal row_act when a rising edge of the chip select signal chip_sel is detected, even though the address transition detecting signal is not activated.

Here, the chip select signal chip_sel is a high active signal and the rising edge of the chip select signal chip-sel means the activation time point of the chip select signal chip_sel.

Next, an internal circuit of each unit will be described below.

FIG. 2 is an internal circuit diagram of the address input unit shown in FIG. 1

Referring to FIG. 2, the address input unit 10 includes: a PMOS transistor PM1 having a gate receiving the buffer driving signal buf_enb, and a source connected a power supply voltage VDD; a PMOS transistor PM2 having a gate receiving the address add, a source connected to a drain of the PMOS transistor PM1, and a drain connected to an output node; an NMOS transistor NM1 having a gate receiving the buffer driving signal buf_enb and a drain-source path between the output node and a ground voltage VSS; and an NMOS transistor MN2 having a gate receiving the address add, and a drain-source path between the output node and the ground voltage VSS.

The address input unit 10 outputs the voltage applied on the output node as the internal address int_add.

FIG. 3 is an internal circuit diagram of the transition detecting unit 20 shown in FIG. 1.

Referring to FIG. 3, the transition detecting unit 20 includes: an inverter I1 for inverting the internal address int_add to output an inverted internal address; rising edge detectors 22 and 24 for detecting a rising edge of the inverted internal address and a rising edge of the internal address int_add, respectively; a NAND gate ND1 configured to receive output signals of the rising edge detectors 22 and 24; and an inverter I2 for inverting an output signal of the NAND gate ND1 to output the address transition detecting signal atdsumb.

FIG. 4 is an internal circuit diagram of the WL driving signal generating unit 30 shown in FIG. 1.

Referring to FIG. 4, the WL driving signal generating unit 30 includes: a signal generator 32 for activating its output signal when the chip select signal chip_sel and the address transition detecting signal atdsumb is activated or the rising edge of the chip select signal chip_sel is detected; an output pulse generator 34 for detecting a rising edge of the output signal of the signal generator 32 to generate the WL driving signal row_act; and a standby unit 36 for changing an output node of the signal generator 32 to a standby state in response to the WL driving signal row_act.

Also, the signal generator 32 includes: an inverter I3 for inverting the address transition detecting signal atdsumb; a rising edge detector 32a for detecting the rising edge of the chip select signal chip_sel; an inverter I4 for inverting an output signal of the rising edge of the rising edge detector 32a; a PMOS transistor PM3 having a gate receiving the chip select signal chip_sel and a source-drain path between the power supply voltage VDD and th output node; an NMOS transistor NM3 having a gate receiving the chip select signal chip_sel and a drain connected to the output node; an NMOS transistor NM4 having a gate receiving an output signal of the inverter I3, a drain connected to the source of the NMOS transistor NM3, and a source connected to the ground voltage VSS; and an NMOS transistor NM5 having an output signal of the inverter I4 and a drain-source path between the output node and the ground voltage VSS.

The output pulse generator 34 includes: a latch 34a for latching the output signal of the signal generator 32; a rising edge detector 34b for detecting the rising edge of the output signal of the latch 34a; and an inverter I5 for inverting an output signal of the rising edge detector 34b to output the WL driving signal row_act.

The standby unit 36 includes: an inverter 16 for inverting the WL driving signal row_act; a delay unit 36a for delaying an output signal of the inverter 16; and a PMOS transistor PM4 having a gate receiving an output signal of the delay unit 36a and a source-drain path between the power supply voltage VDD and the output node.

An operation of the WL driving signal generating unit 30 will be described briefly.

When the address transition detecting signal atdsumb is activated during the activation of the chip select signal chip_sel, the signal generator 32 activates its output signal in response to the address transition signal atdsumb, or activates its output signal when the chip select signal chip_sel is activated. The output pulse generator 34 detects the rising edge of the output signal of the signal generator 32 to generate the WL driving signal row_act in a pulse form. The standby unit 36 sets the output node of the signal generator 32 to logic high level in response to the activation of the WL driving signal row_act. Accordingly, it is ready for an activation of a next address transition detecting signal atdsumb or chip select signal chip_sel.

In case where such a conventional pseudo SRAM is used, if a level of the address also changes when the chip select signal chip_sel is activated, there occurs a problem in that the WL driving signal row_act is also generated. This will be described below in detail.

FIG. 5 is an operation waveform of the conventional pseudo SRAM shown in FIG. 1.

Referring to FIG. 5, when the address is inputted together with the chip select command CSB, the buffer driving signal buf_enb and the chip select signal chip_sel are activated in response to the chip select command CSB. Then, the WL driving signal generating unit 30 detects the rising edge of the chip select signal chip_sel to activate the WL driving signal row_act. Also, when the address input unit 10 is enabled in response to the activation of the buffer driving signal buf_enb and thus receives the address add, the transition detecting unit 20 detects the transition of the address add to activate the address transition detecting signal atdsumb. Then, the WL driving signal generating unit 30 again activates the WL driving signal row_act in response to the activation of the chip select signal chip_sel and the address transition detecting signal atdsumb.

Meanwhile, an internal path where the WL driving signal is generated by the chip select command is different from an internal path where the WL driving signal is generated by the transition of the address. Accordingly, the transition of the address together with the activation of the chip select command leads to unintended generation of the WL driving signal due to the different path. Consequently, the power is consumed unnecessarily and the operating time becomes long.

SUMMARY OF INVENTION

It is, therefore, an object of the present invention to provide a semiconductor memory device and a driving method thereof, which can reduce power consumption and operation delay time by preventing an overlapped driving of word lines.

In accordance with an aspect of the present invention, there is provided a pseudo SRAM with common pad for address pin and data pin, including: an address input unit for receiving an address through a pin and outputting the received address as an internal address; a transition detecting unit for detecting a transition of the internal address; a word line (WL) driving signal generating unit for generating a WL driving signal in response to an output signal of the transition detecting unit; and a control signal generating unit, in response to a pin select signal, for generating a first control signal for controlling the address input unit to output only an valid address as the internal address, and a second control signal for controlling the WL driving signal generating unit to activate the WL driving signal.

BRIEF DESCRIPTION OF THE DRAWINGS

The above and other objects and features of the present invention will become apparent from the following description of preferred embodiments taken in conjunction with the accompanying drawings, in which:

FIG. 11 is an operation waveform of the pseudo SRAM shown in FIG. 6 when address and buffer driving signal are activated together.

DETAILED DESCRIPTION OF INVENTION

Hereinafter, the preferred embodiments of the present invention will be described in detail with reference to the accompanying drawings.

A pseudo SRAM in accordance with the present invention shares an address pin and a data pin. When a pin select signal ADVb has a logic high level, a signal inputted through a pin is recognized as data. On the contrary, when the pin select signal ADVb has a logic low level, a signal inputted through a pin is recognized as an address.

In the prior art, a transition of a chip select signal chip_sel and an address is detected to generate a WL driving signal row_act. However, in the present invention, a transition of a pin select signal ADVb and an address is detected to generate a WL driving signal row_act. That is, the pin select signal ADVb has the same role as the conventional chip select signal chip_sel.

Figure 1:
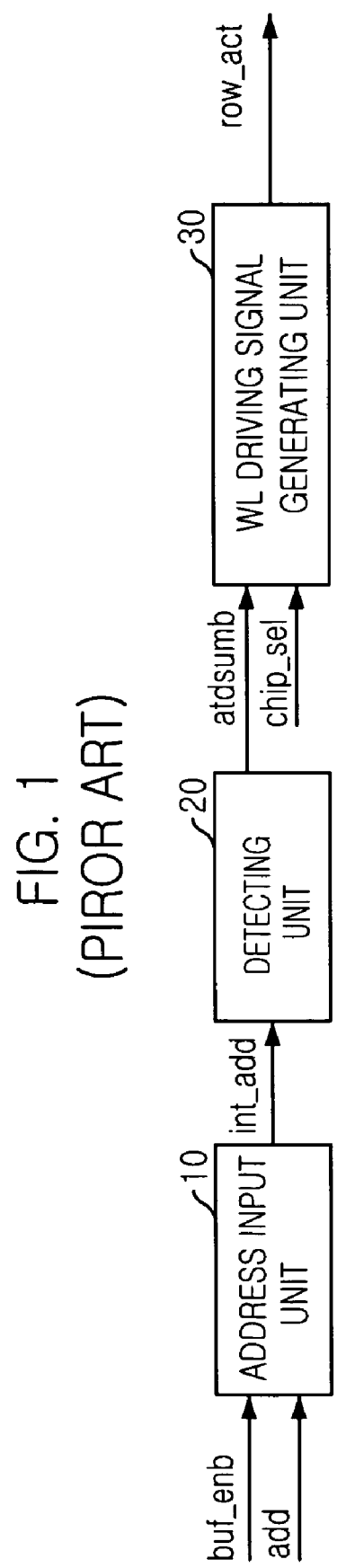
FIG. 1 is a block diagram of a conventional pseudo SRAM.
Figure 2:
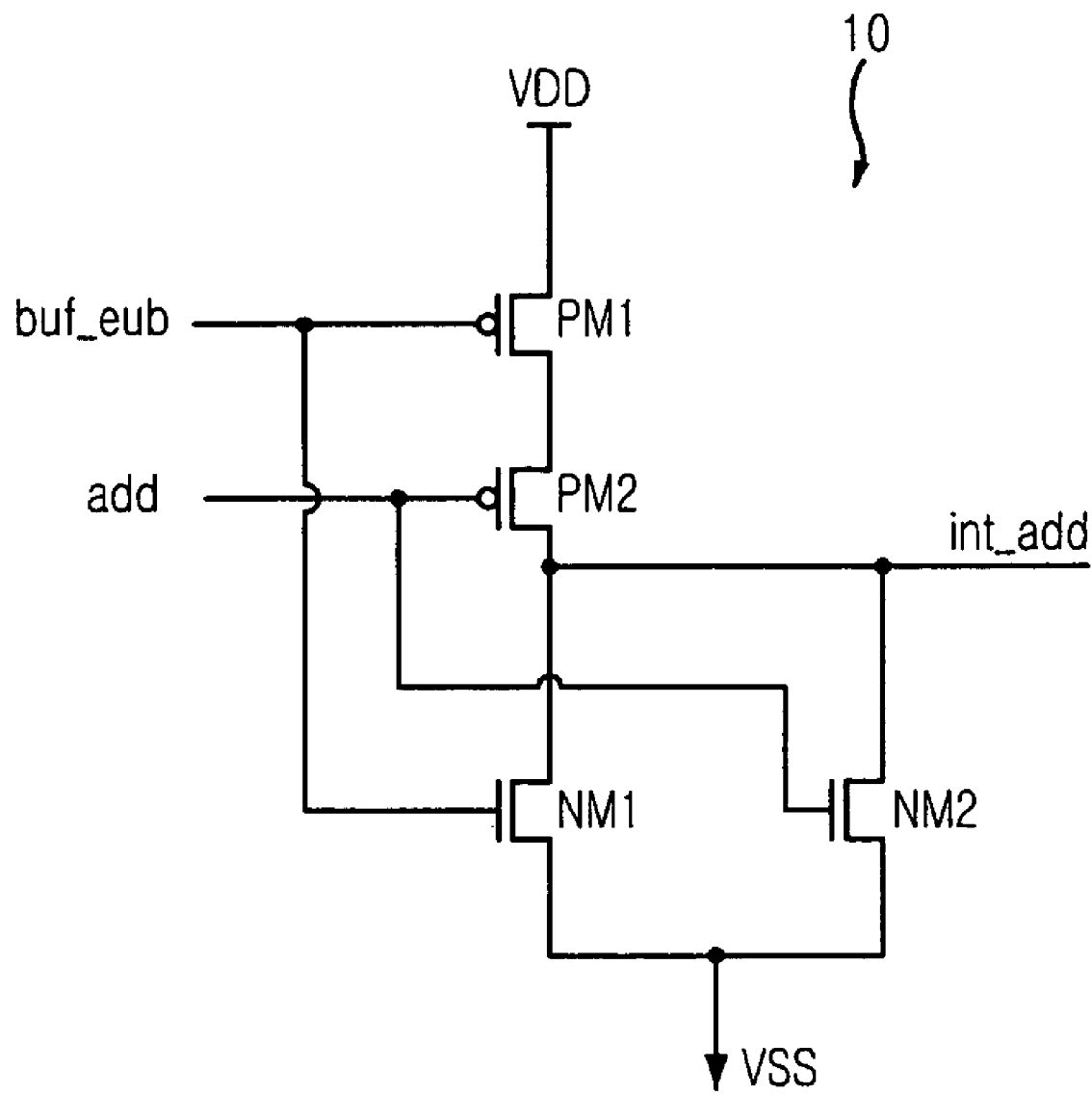
FIG. 2 is an internal circuit diagram of an address input unit shown in FIG. 1.
Figure 3:
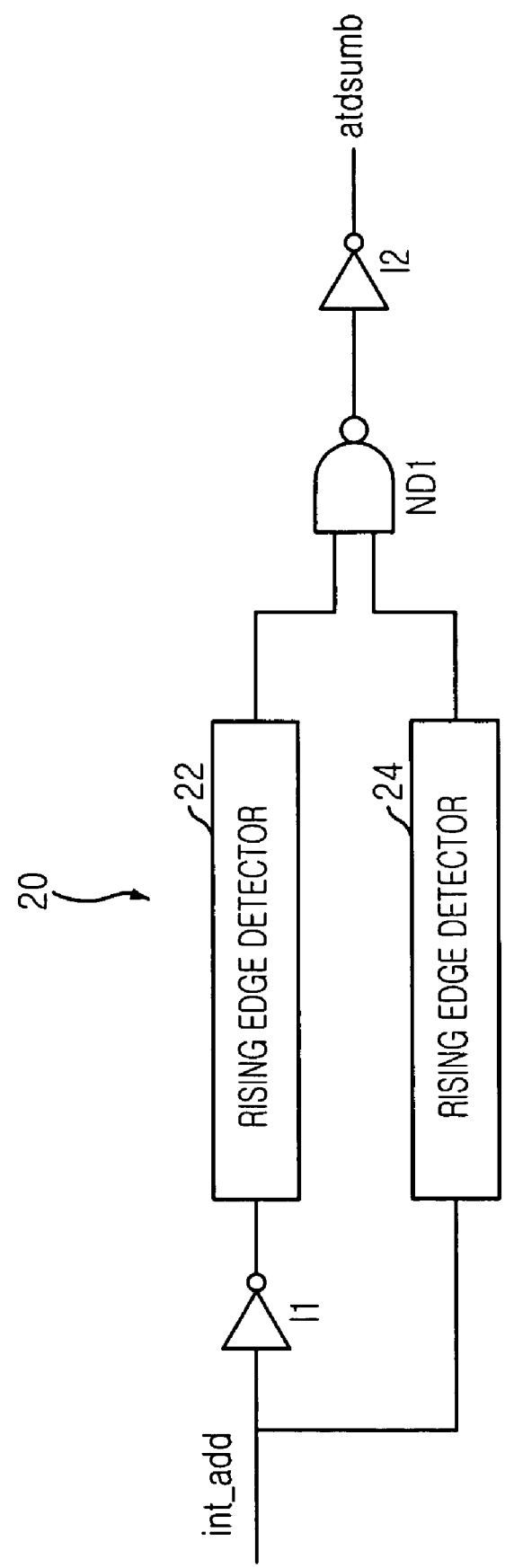
FIG. 3 is an internal circuit diagram of a transition detecting unit shown in FIG. 1.
Figure 4:
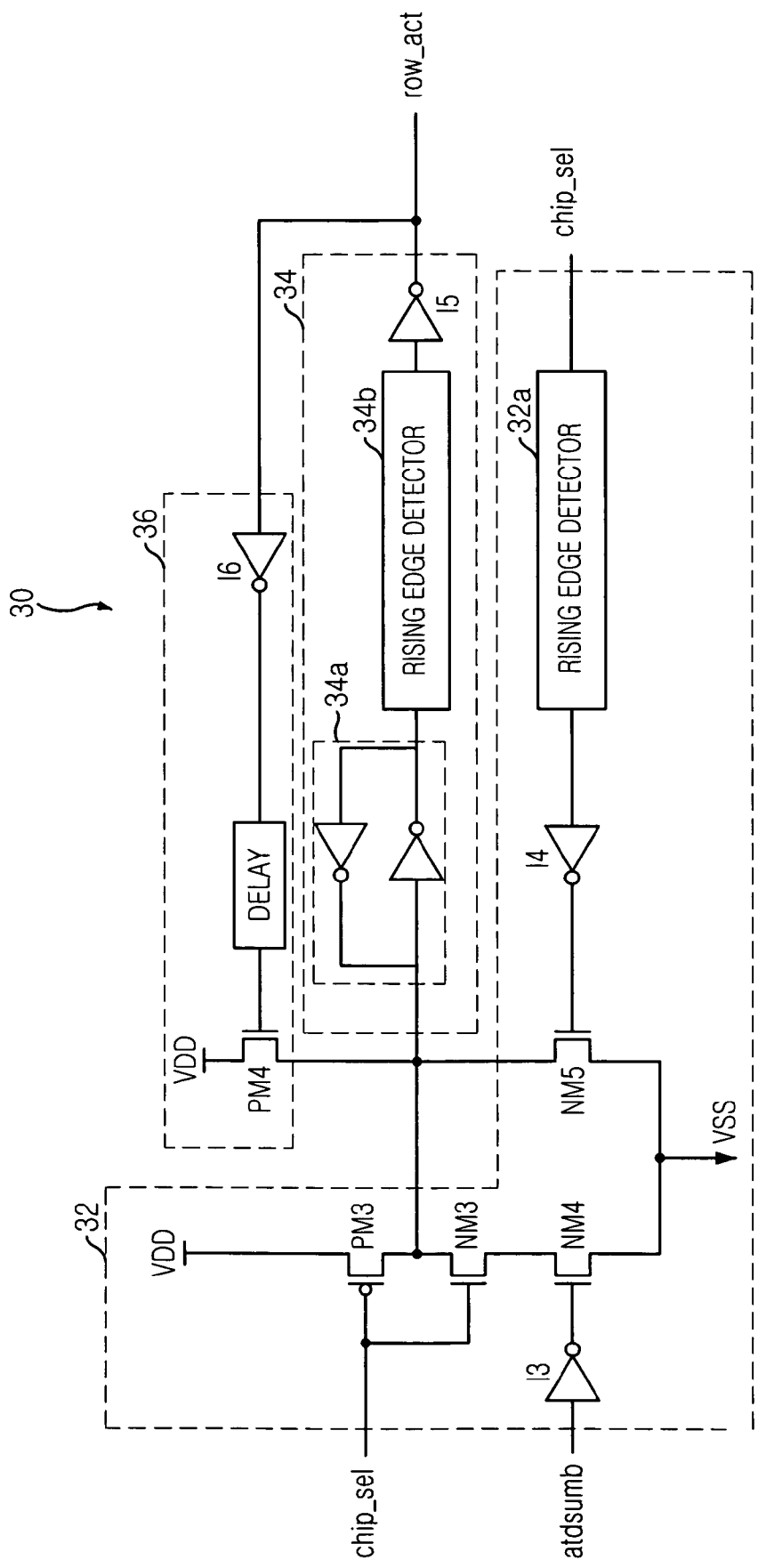
FIG. 4 is an internal circuit diagram of a word line driving signal generating unit shown in FIG. 1.
Figure 5:
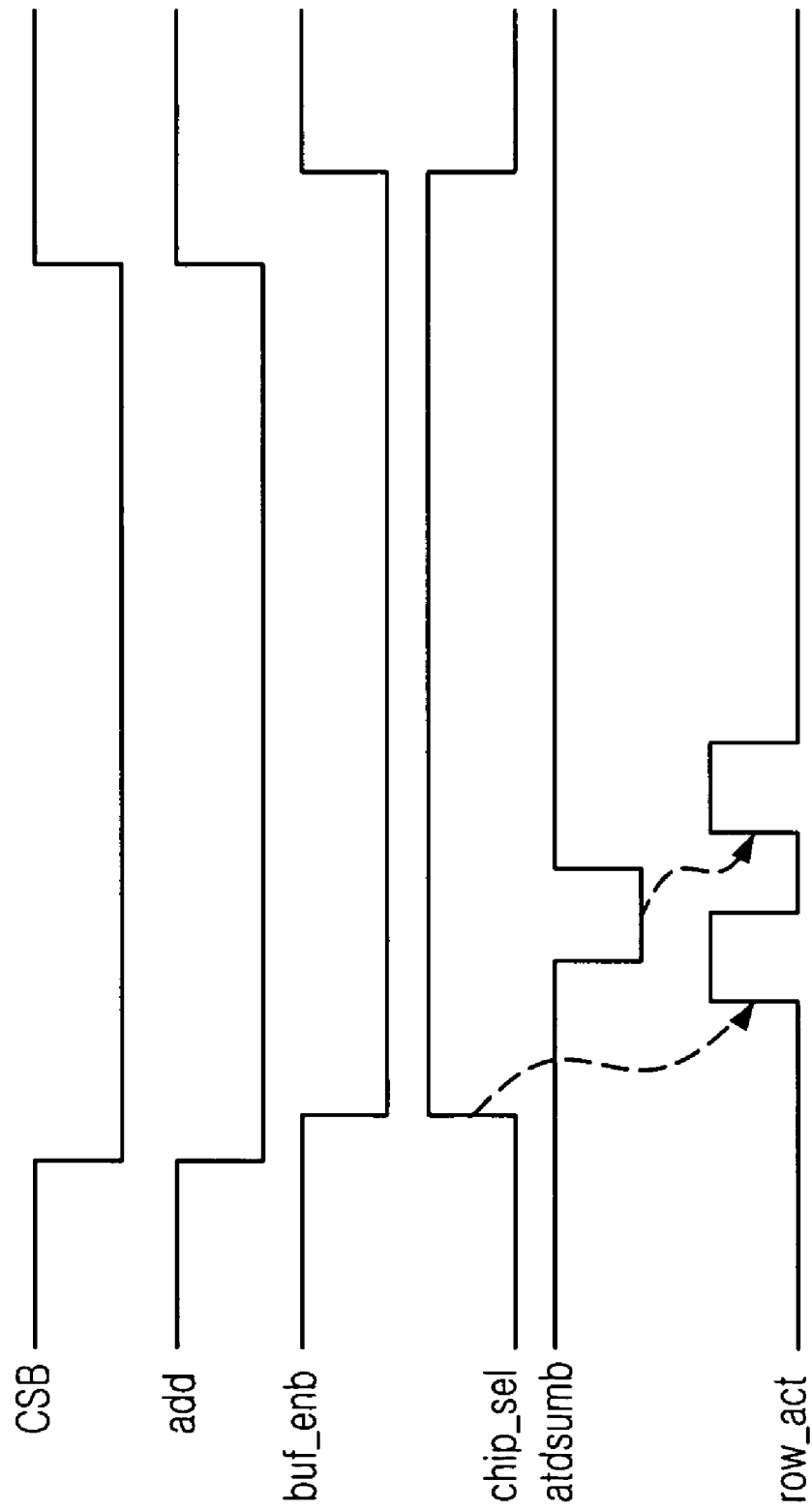
FIG. 5 is an operation waveform of the conventional pseudo SRAM shown in FIG. 1.
Figure 6:
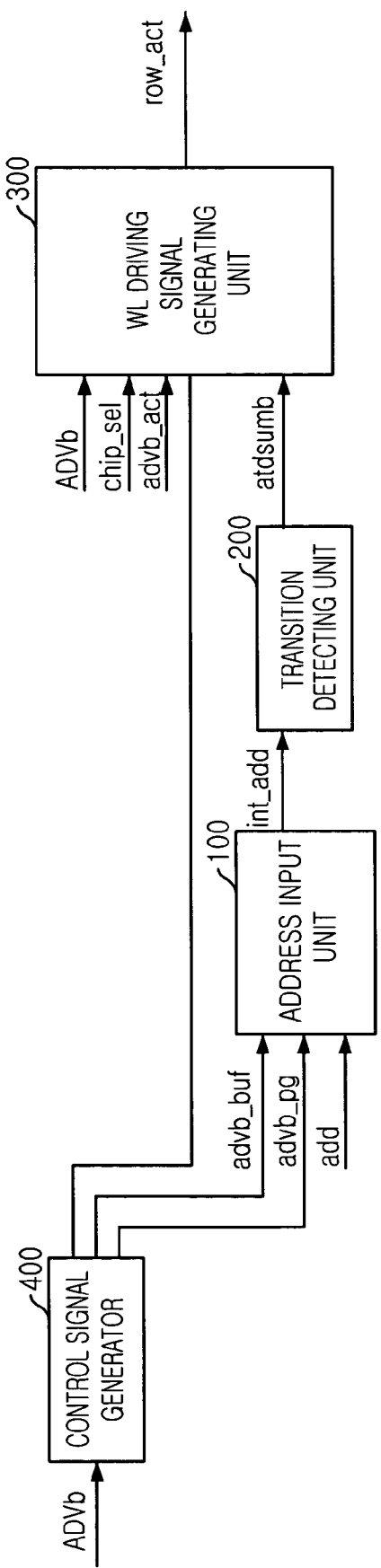
FIG. 6 is a block diagram of a pseudo SRAM with common pad for address pin and data pin in accordance with an embodiment of the present invention.

FIG. 6 is a block diagram of a pseudo SRAM with common pad for address pin and data pin in accordance with an embodiment of the present invention.

Referring to FIG. 6, the pseudo SRAM in accordance with an embodiment of the present invention includes: an address input unit 100 for outputting an address add inputted through a pin as an internal address int_add; a transition detecting unit 200 for detecting a transition of the internal address int_add; a WL driving signal generating unit 300 for generating a WL driving signal row_act in response to an output signal of the transition detecting unit 200; and a control signal generating unit 400 for generating a first control signal for controlling the address input unit 100 to output only an valid address as the internal address int_add, and a second control signal advb_act for controlling the WL driving signal generating unit 300 to activate the WL driving signal row_act.

The first control signal includes an active control signal advb_buf for activating the address input unit 100, and an output control signal advb_pg for outputting only the valid address as the internal address int_add.

Figure 7:
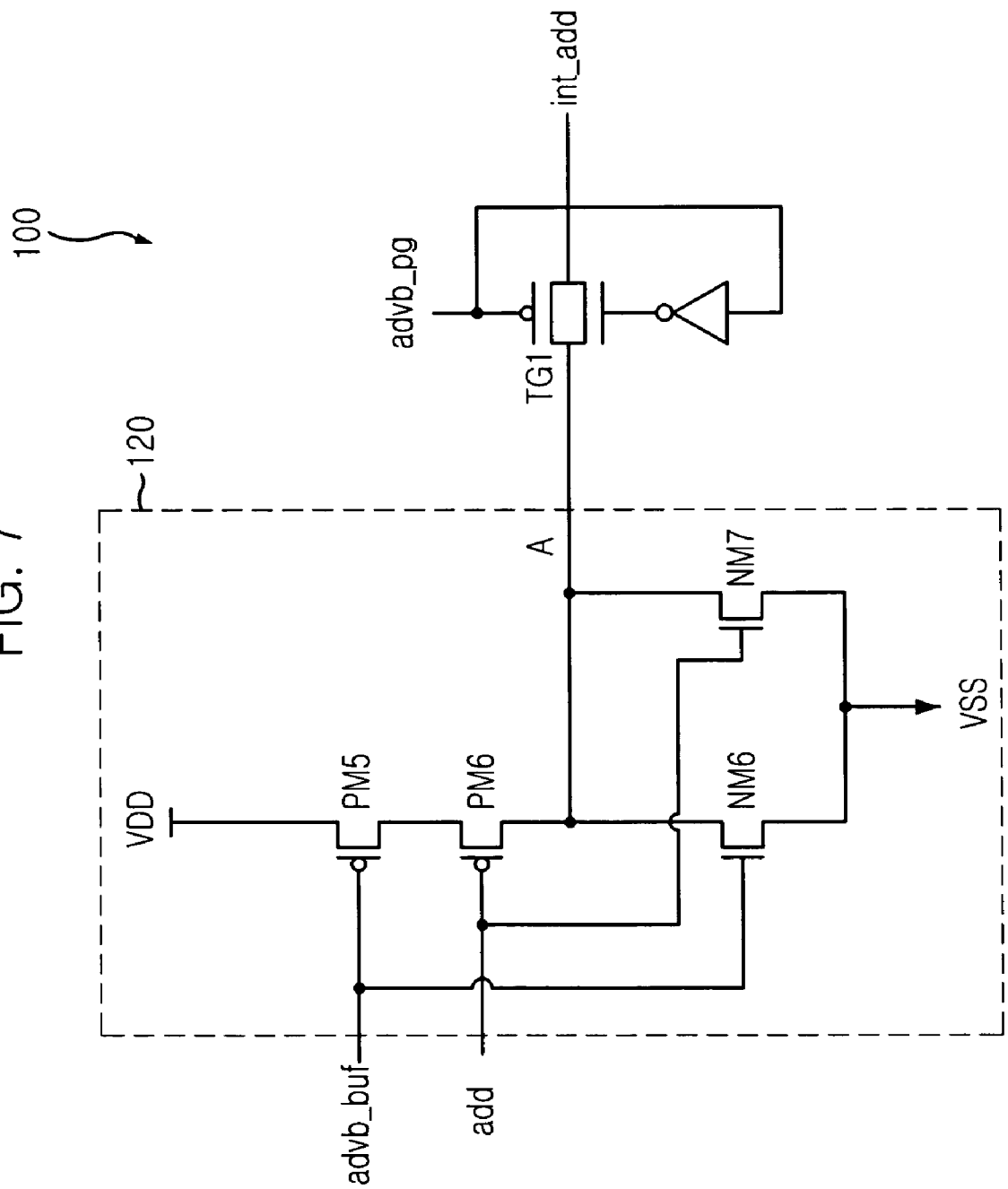
FIG. 7 is an internal circuit diagram of an address input unit shown in FIG. 6.

FIG. 7 is an internal circuit diagram of the address input unit 100 shown in FIG. 6.

Referring to FIG. 7, the address input unit 100 includes an address buffer 120 for receiving the address add in response to the active control signal advb_buf, and a transfer gate TG1 for transferring an output signal of the address buffer 120 as the internal address int_add in response to the output control signal advb_pg.

The address buffer 120 includes: a PMOS transistor PM5 having a gate receiving the active control signal advb_buf and a source connected to a power supply voltage VDD; a PMOS transistor PM6 having a gate receiving the address add and a source-drain path between a drain of the PMOS transistor PM5 and a node A; an NMOS transistor NM7 having a gate receiving the address add and a drain-source path between the node A and a ground voltage VSS; and an NMOS transistor NM6 having a gate receiving the active control signal advb_buf and a drain-source path between the node A and the ground voltage VSS. A voltage applied on the node A is outputted as an output signal.

Since the address input unit 100 further includes the transfer gate TG1, an address remaining at the node A before the active control signal advb_buf is activated is prevented from being outputted as the internal address int_add. When the active control signal advb_buf is deactivated, the node A is in a logic low level. Therefore, it may cause the same result as the case when the address add is in a high level. In this case, however, the transfer gate TG1 prevents the invalid internal address from being outputted.

Also, the output control signal advb_pg is a signal that is activated with the same as an internal delay given until the address add inputted through the pin reaches the node A. This secures an address hold time margin as to whether a signal inputted through the pin at a time point when the pin select signal ADVb changes from a logic low level to a logic high level is recognized as a data or a address. Though the address hold time margin can be secured by adding the delay unit on the internal address generation path, this decreases the operating speed.

The address input unit 100 outputs the valid internal address int_add using the output control signal advb_pg having the delay amount as much as the internal delay given until the address is outputted as the internal address int_add and the transfer gate TG1 controlled by the output control signal advb_pg. Also, the address hold time margin is secured without any operation delay of the pseudo SRAM.

Figure 8:
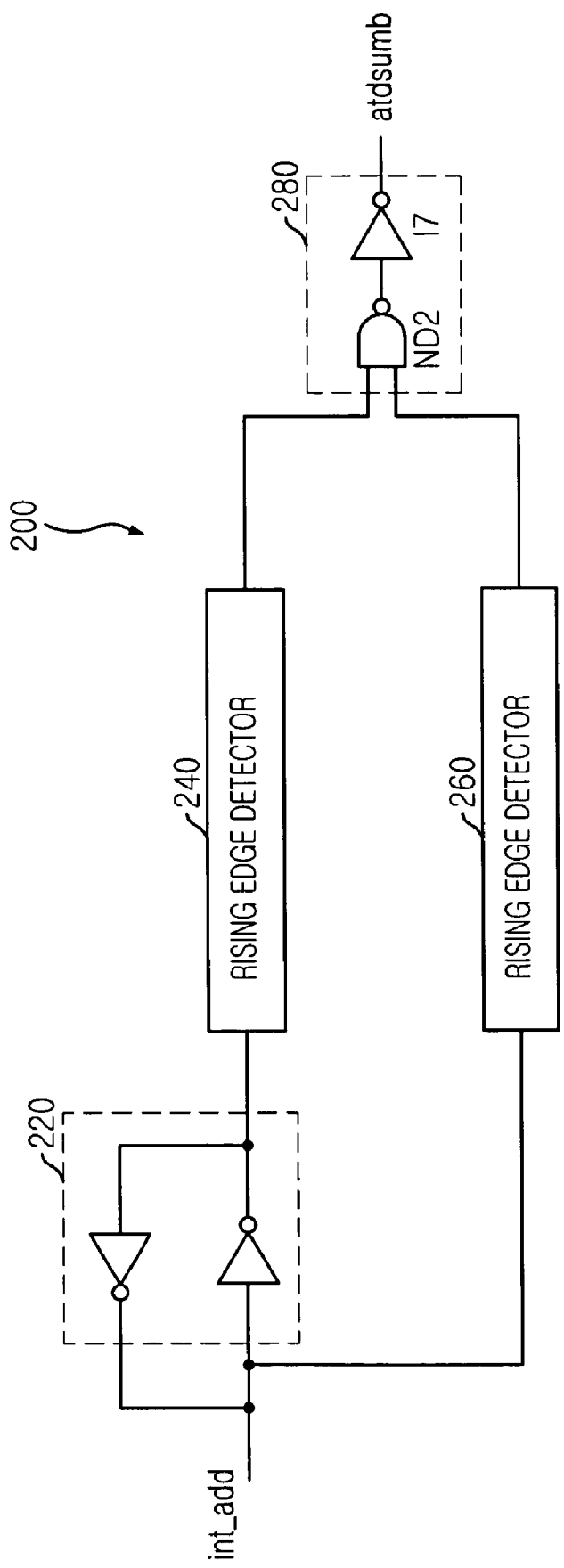
FIG. 8 is an internal circuit diagram of a transition detecting unit shown in FIG. 6.

FIG. 8 is an internal circuit diagram of the transition detecting unit 200 shown in FIG. 6.

Referring to FIG. 8, the transition detecting unit 200 includes: a latch 220 for latching the internal address signal int_add; a first rising edge detecting unit 240 for detecting a rising edge of the output signal of the latch 220; a second rising edge detecting unit 260 for detecting a rising edge of the internal address int_add; and an output unit 280 for logically combining output signals of the rising edge detecting units 240 and 260 to output the address transition detecting signal atdsumb.

The output unit 280 includes a NAND gate ND2 receiving the output signals of the rising edge detecting units 240 and 260, and an inverter I7 for inverting an output signal of the NAND gate ND2 to output the address transition detecting signal atdsumb.

When detecting the rising edges of the output signals of the rising edge detecting units 240 and 260, the output unit 280 activates the output signal to a low level.

Figure 9:
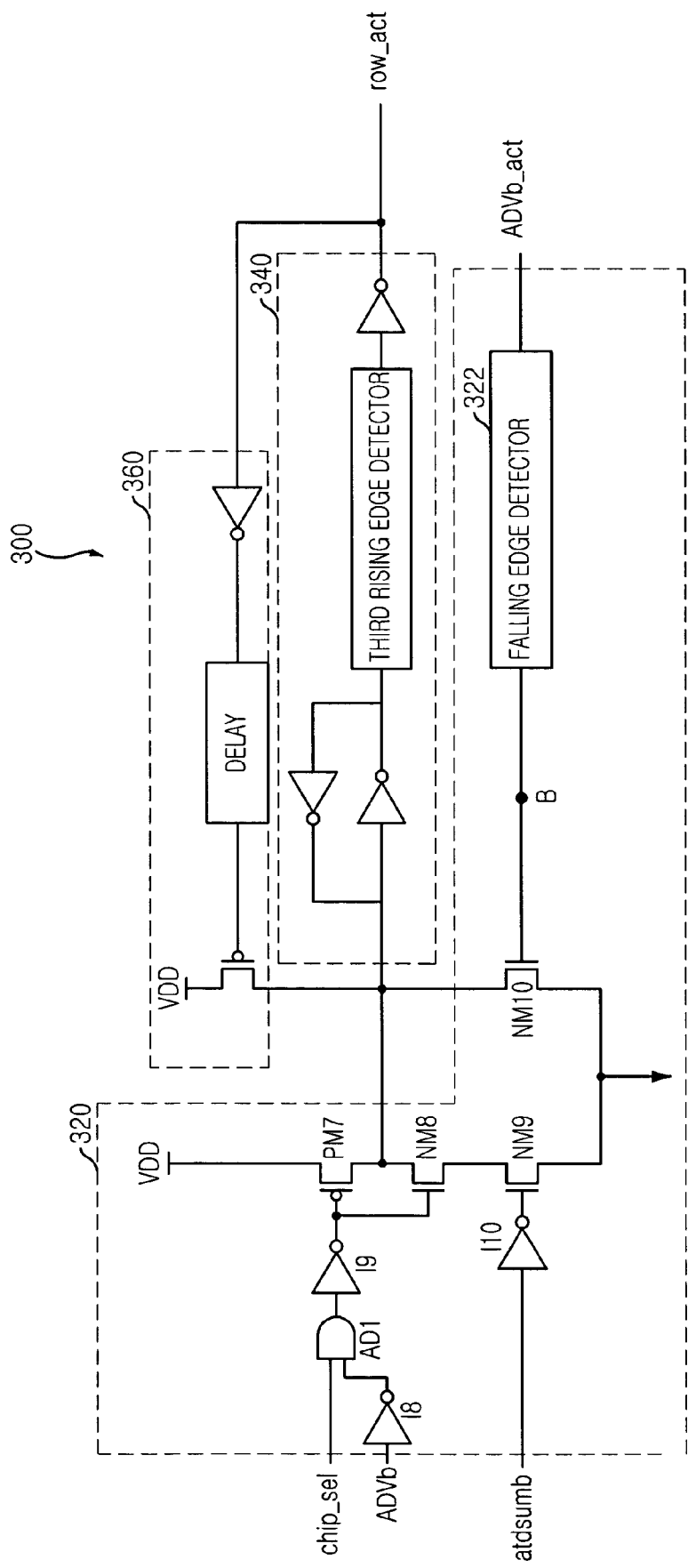
FIG. 9 is an internal circuit diagram of a word line driving signal generating unit shown in FIG. 6.

FIG. 9 is an internal circuit diagram of the WL driving signal generating unit 300 shown in FIG. 6.

Referring to FIG. 9, the WL driving signal generating unit 300 includes: a signal generator 320 for generating a signal in response to the second control signal advb_act and the address transition detecting signal atdsumb; an output pulse generator 340 for generating the WL driving signal row_act in a pulse form in response to the output signal of the signal generator 320; and a standby unit 360 for setting the output node of the signal generator 320 to a standby state in response to the WL driving signal row_act.

The signal generator 320 activates its output signal in response to the address transition detecting signal atdsumb when the chip select signal chip_sel and the pin select signal ADVb are activated, and activates the output signal in response to a falling edge of the second control signal advb_act.

The signal generator 320 includes: inverters I8 and I10 for inverting the pin select signal ADVb and the address D transition detecting signal atdsumb, respectively; an AND gate AD1 configured to receive an output signal of the inverter I8 and the chip select signal chip_sel; an inverter I9 for inverting an output signal of the AND gate AD1; a falling edge detector 322 for detecting a falling edge of the second control signal advb_act; a PMOS transistor PM7 having a gate receiving an output signal of the inverter I9 and a source-drain path between the power supply voltage VDD and the output node; an NMOS transistor NM8 having a gate receiving the output signal of the inverter I9 and a drain connected to the output node; an NMOS transistor NM9 having a gate receiving an output signal of the inverter I10, a drain connected to a source of the NMOS transistor NM8, and a source connected to the ground voltage VSS; and an NMOS transistor NM10 having a gate receiving an output signal of the falling edge detector 322 and a drain-source path between the output node and the ground voltage VSS.

A node B represents the output node of the falling edge detector 322.

The WL driving signal generating unit 300 activates the WL driving signal row_act in response to the address transition detecting signal atdsumb applied when the chip select signal CSB and the pin select signal ADVb are activated, and it also detects the falling edge of the second control signal advb_act to activate the WL driving signal row_act.

When the pin select signal ADVb and the address add are applied together, the address transition detecting signal atdsumb and the second control signal advb_act are simultaneously activated. Thus, the overlapped generation of the WL driving signal row_act does not happen. The reason is because the second control signal advb_act is delayed by the internal delay time given until the address add is outputted as the address transition detecting signal atdsumb.

Figure 10:
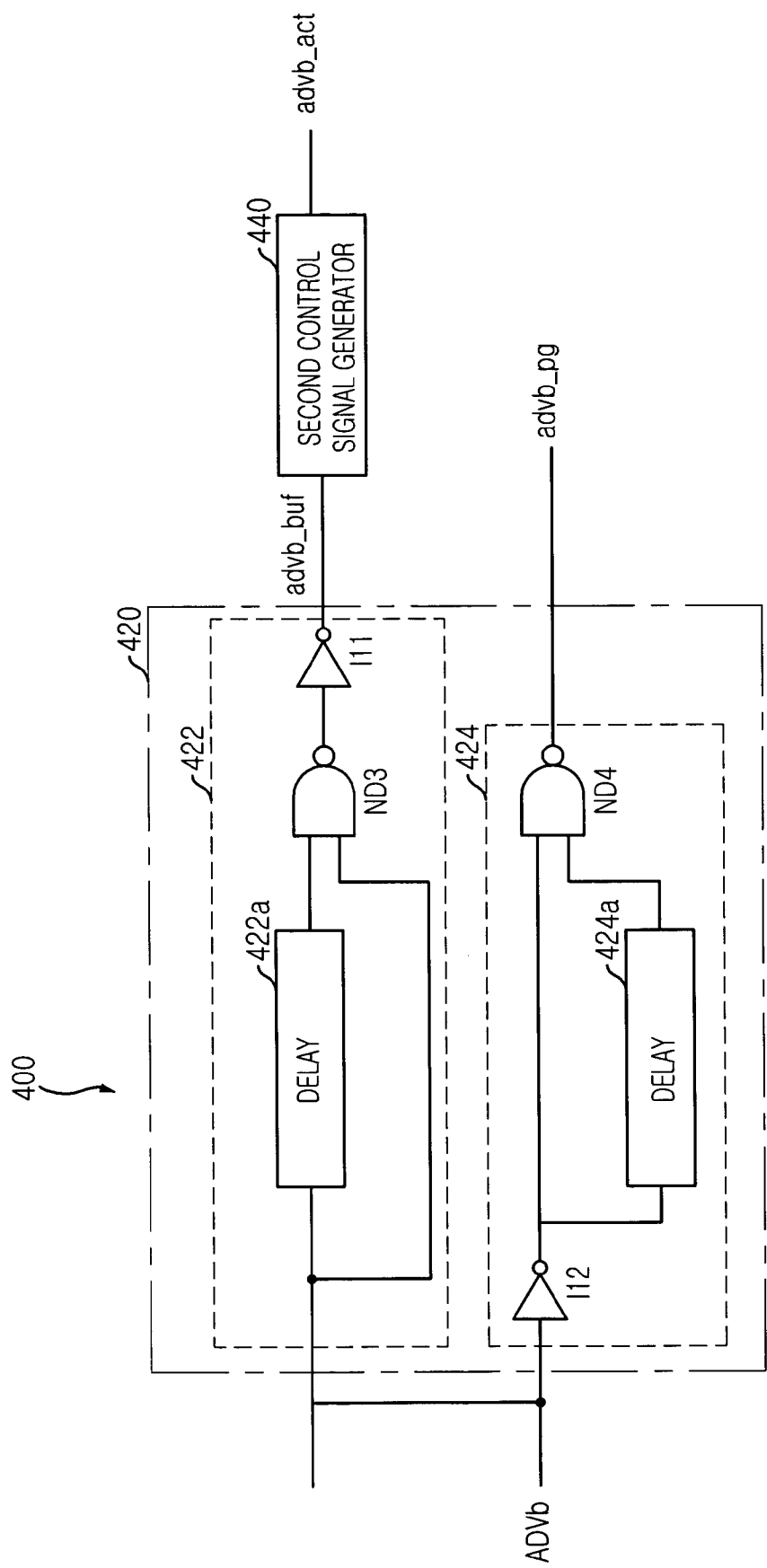
FIG. 10 is an internal circuit diagram of a control signal generating unit shown in FIG. 6.

FIG. 10 is an internal circuit diagram of the control signal generating unit 400.

Referring to FIG. 10, the control signal generating unit 400 includes: a first control signal generator 420 for receiving the pin select signal ADVb to generate the active control signal advb_buf and the output control signal advb_pg; and a second control signal generator 440 for receiving the active control signal advb_buf to generate the second control signal advb_act.

Also, the first control signal generator 420 includes: an active control signal generator 422 for delaying the pin select signal ADVb by a predetermined time to output the active control signal advb_buf; and an output control signal generator 424 for delaying the pin select_signal ADVb by the internal delay time given until the address add is outputted as the output signal of the address buffer 120, and outputting the output control signal advb_pg.

The active control signal generator 422 includes: a delay unit 422a for delaying the pin select signal ADVb; a NAND gate ND3 configured to receive an output signal of the delay unit 422a and the pin select signal ADVb; and an inverter I11 for inverting an output signal of the NAND gate ND3 to output the active control signal advb_buf.

The output control signal generator 424 includes: an inverter I12 for inverting the pin select signal ADVb; a delay unit 424a for delaying an output signal of the inverter I12; and a NAND gate ND4 configured to receive an output signal of the delay unit 424a and the output signal of the inverter I12 to output the active control signal advb_pg.

The second control signal generator 440 delays the active control signal advb_buf to output the second control signal advb_act for a predetermined time until the address add is outputted as the output signal of the transition detecting unit 200.

The delay unit 424a has a delay time corresponding to the internal delay given until the address add is outputted as the output signal of the address buffer 120.

FIG. 11 is an operation waveform of the pseudo SRAM shown in FIG. 6 when the pin select signal and the address are activated together.

Referring to FIG. 11, the chip select command CSB and the pin select signal ADVb have logic low level and the address is inputted. If the active control signal generating unit 420 generates the active control signal advb_buf in response to the pin select signal ADVb, the address buffer 120 is activated and receives the address. Also, the transfer gate TG1 outputs the output signal of the address buffer 120 as the internal address int_add in response to the output control signal advb_pg generated by the output control signal generating unit 424.

Then, the transition detecting unit 200 detects the transition of the internal address int_add to activate the address transition detecting signal atdsumb. Meanwhile, the second control signal advb_act is activated by the second control signal generator 440, and the falling edge is detected by the falling edge detector 322.

Accordingly, the signal generator 320 activates the WL driving signal row_act in response to the address transition detecting signal atdsumb and the falling edge of the second control signal advb_act.

A node B represents an output signal of the falling edge detector 322.

In the pseudo SRAM, the second control signal for driving the word line at the activation of the pin select signal ADVb is activated with the same delay time as the internal delay given until the address add and the address transition detecting signal atdsumb are activated. Accordingly, even when the pin select signal ADVb and the address add are inputted together, power consumption and operation delay due to the unintended driving of the word line are not caused.

When the data pin and the address pin are shared, delay for securing the margin is needed so as to validly receive the signal, applied through the pin, as the data or address signal. Since the pseudo SRAM in accordance with the present invention controls the final path through which the inputted address is outputted as the internal address, the valid address can be received without any delay. Consequently, the operation of the device is not delayed.

The present application contains subject matter related to Korean patent application No. 2004-58810, filed in the Korean Patent Office on Jul. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A pseudo synchronous random access ram (SRAM) with common pad for address pin and data pin, the pseudo SRAM comprising:
    an address input unit for receiving an address through a pin and outputting the received address as an internal address;
    a transition detecting unit for detecting a transition of the internal address;
    a word line (WL) driving signal generating unit for generating a WL driving signal; and
    a control signal generating unit, in response to a pin select signal indicating whether a signal input through the pin is an address signal or a data signal, for generating a first control signal for controlling the address input unit to output only an valid address as the internal address, and a second control signal for controlling the WL driving signal generating unit,
    wherein the WL driving signal generating unit is configured for generating the WL driving signal in response to an output signal of the transition detecting unit and the second control signal.

2. The pseudo SRAM as recited in claim 1, wherein the first control signal includes an active control signal for activating the address input unit, and an output control signal for outputting only the valid address as the internal address.

3. The pseudo SRAM as recited in claim 2, wherein the control signal generating unit includes:
    a first control signal generator for receiving the pin select signal to generate the active control signal and the output control signal; and
    a second control signal generator for receiving the active control signal to generate the second control signal.

4. The pseudo SRAM as recited in claim 3, wherein the second control signal generator delays the active control signal by an internal delay time given until the address is outputted as the output signal of the transition detecting unit, and generating the second control signal.

5. The pseudo SRAM as recited in claim 2, wherein the address input unit includes:
    an address buffer for receiving the address in response to the active control signal; and
    a transfer gate for transferring an output signal of the address buffer as the internal address in response to the output control signal.

6. The pseudo SRAM as recited in claim 5, wherein the first control signal generator includes:

an active control signal generator for delaying the pin select signal by a predetermined time to output the active control signal; and
an output control signal generator for delaying the pin select signal by an internal delay time until the address is outputted as the output signal of the address buffer, and outputting the output control signal.

7. The pseudo SRAM as recited in claim 6, wherein the output control signal generator includes:
a first inverter for inverting the pin select signal;
a first delay unit for delaying an output signal of the first inverter;
a first NAND gate configured to receive an output signal of the first delay unit and the output signal of the first inverter; and
a second inverter for inverting an output signal of the first NAND gate to output the active control signal.

8. The pseudo SRAM as recited in claim 7, wherein the active control signal generator includes:
a second delay unit for delaying the pin select signal;
a second NAND gate configured to receive an output signal of the second delay unit and the pin select signal; and
a third inverter for inverting an output signal of the second NAND gate to output the active control signal.

9. The pseudo SRAM as recited in claim 8, wherein the first delay unit has a delay time corresponding to an internal delay until the address is transferred as the output signal of the address buffer.

10. The pseudo SRAM as recited in claim 9, wherein the address buffer includes:
a first PMOS transistor having a gate receiving the active control signal, and a source connected to a first voltage;
a second PMOS transistor having a gate receiving the address, and a drain-source path between a drain of the first PMOS transistor and an output node;
a first NMOS transistor having a gate receiving the address, and a drain-source path between the output node and a second voltage; and
a second NMOS transistor having a gate receiving the active control signal, and a drain-source path between the output node and the second voltage, such that a voltage applied on the output node is outputted as the output signal.

11. The pseudo SRAM as recited in claim 2, wherein the transition detecting unit includes:
a latch for latching the internal address;
a first rising edge detector for detecting a rising edge of an output signal of the latch;
a second rising edge detector for detecting a rising edge of the internal address; and
an output unit for logically combining output signals of the first and second rising edge detectors to output an address transition detecting signal.

12. The pseudo SRAM as recited in claim 11, wherein first and second rising edge detectors activate the output signal to a logic low level when a rising edge of an input signal is detected.

13. The pseudo SRAM as recited in claim 12, wherein the output unit includes:
a first NAND gate configured to receive the output signals of the first and second rising edge detectors; and
a first inverter for inverting an output signal of the first NAND gate to output the address transition detecting signal.

14. The pseudo SRAM as recited in claim 13, wherein the address input unit includes:

an address buffer for receiving the address in response to the active control signal; and
a transfer gate for transferring an output signal of the address buffer as the internal address in response to the output control signal.

15. The pseudo SRAM as recited in claim 14, wherein the first control signal generator includes:
an active control signal generator for delaying the pin select signal by a predetermined time to output the active control signal; and
an output control signal generator for delaying the pin select signal by an internal delay time until the address is outputted as the output signal of the address buffer, and outputting the output control signal.

16. The pseudo SRAM as recited in claim 15, wherein the output control signal generator includes:
a first inverter for inverting the pin select signal;
a first delay unit for delaying an output signal of the first inverter;
a first NAND gate configured to receive an output signal of the first delay unit and the output signal of the first inverter; and
a second inverter for inverting an output signal of the first NAND gate to output the active control signal.

17. The pseudo SRAM as recited in claim 16, wherein the active control signal generator includes:
a second delay unit for delaying the pin select signal;
a second NAND gate configured to receive an output signal of the second delay unit and the pin select signal; and
a third inverter for inverting an output signal of the second NAND gate to output the active control signal.

18. The pseudo SRAM as recited in claim 17, wherein the first delay unit has a delay time corresponding to an internal delay until the address is transferred as the output signal of the address buffer.

19. The pseudo SRAM as recited in claim 18, wherein the address buffer includes:
a first PMOS transistor having a gate receiving the active control signal, and a source connected to a first voltage;
a second PMOS transistor having a gate receiving the address, and a drain-source path between a drain of the first PMOS transistor and an output node;
a first NMOS transistor having a gate receiving the address, and a drain-source path between the output node and a second voltage; and
a second NMOS transistor having a gate receiving the active control signal, and a drain-source path between the output node and the second voltage, such that a voltage applied on the output node is outputted as the output signal.

20. The pseudo SRAM as recited in claim 2, wherein the WL driving signal generating unit includes:
a signal generator for outputting a signal in response to the second control signal and an output signal of the transition detecting unit;
an output pulse generator for generating a WL driving signal in a pulse form in response to an output signal of the signal generator; and
a standby unit for setting an output node of the signal generator to a standby state in response to the WL driving signal.

21. The pseudo SRAM as recited in claim 20, wherein address input unit includes:
an address buffer for receiving the address in response to the active control signal; and a transfer gate for transferring an output signal of the address buffer as the internal address in response to the output control signal.

22. The pseudo SRAM as recited in claim 21, wherein the first control signal generator includes:
    an active control signal generator for delaying the pin select signal by a predetermined time to output the active control signal; and
    an output control signal generator for delaying the pin select signal by an internal delay time until the address is outputted as the output signal of the address buffer, and outputting the output control signal.

23. The pseudo SRAM as recited in claim 22, wherein the signal generator includes:
    a first inverter for inverting the pin select signal;
    an AND gate configured to receive an output signal of the first inverter and the chip select signal;
    a second inverter for inverting an output signal of the AND gate;
    a third inverter for inverting the address transition detecting signal;
    a falling edge detector for detecting a falling edge of the second control signal;
    a first PMOS transistor having a gate receiving an output signal of the second inverter, and a source-drain path between a first voltage and an output node;
    a first NMOS transistor having a gate receiving an output signal of the second inverter and a drain connected to the output node;
    a second NMOS transistor having a gate receiving an output signal of the third inverter, a drain connected to a source of the first NMOS transistor, and a source connected to the second voltage; and
    a third NMOS transistor having a gate receiving an output signal of the falling edge detector, and a drain-source path between the output node and the second voltage, such that a voltage applied on the output node is outputted as the output signal.

24. The pseudo SRAM as recited in claim 23, wherein the output unit includes:
    a latch for latching the output signal of the signal generator;
    a rising edge detector for detecting a rising edge of the output signal of the latch; and
    a fourth inverter for inverting an output signal of the rising edge detector to output the WL driving signal.

25. The pseudo SRAM as recited in claim 24, wherein the standby unit includes:

a fifth inverter for inverting the WL driving signal; and
a second PMOS transistor having a gate receiving an output signal of the fifth inverter, and a source-drain path between the first voltage and the output node.

26. The pseudo SRAM as recited in claim 25, wherein the output control signal generator includes:
    a first inverter for inverting the pin select signal;
    a first delay unit for delaying an output signal of the first inverter;
    a first NAND gate configured to receive an output signal of the first delay unit and the output signal of the first inverter; and
    a second inverter for inverting an output signal of the first NAND gate to output the active control signal.

27. The pseudo SRAM as recited in claim 26, wherein the active control signal generator includes:
    a second delay unit for delaying the pin select signal;
    a second NAND gate configured to receive an output signal of the second delay unit and the pin select signal; and
    a third inverter for inverting an output signal of the second NAND gate to output the active control signal.

28. The pseudo SRAM as recited in claim 27, wherein the first delay unit has a delay time corresponding to an internal delay until the address is transferred as the output signal of the address buffer.

29. A method for driving a pseudo SRAM with common pad for address pin and data pin, the method comprising the steps of:
    activating a pin select signal and applying an address together with the activated pin select signal;
    outputting the address as an internal address in response to an output control signal generated by delaying the pin select signal during an internal delay time of the address;
    detecting a transition of the internal address to generate an address transition detecting signal;
    generating a control signal by delaying the pin select signal for an internal delay time given until the address is outputted as the address transition detecting signal; and
    generating a word line driving signal in response to the address transition detecting signal and the control signal activated together.

* * * * *